US008130522B2

(12) United States Patent
Maksimovic

(10) Patent No.: US 8,130,522 B2
(45) Date of Patent: Mar. 6, 2012

(54) DIGITAL POWER FACTOR CORRECTION

(75) Inventor: Dragan Maksimovic, Boulder, CO (US)

(73) Assignee: The Regents of the University of Colorado, A Body Corporate, Denver, CO (US)

(*) Notice: Subject to any disclaimer, the term of this patent is extended or adjusted under 35 U.S.C. 154(b) by 747 days.

(21) Appl. No.: 12/112,919

(22) Filed: Apr. 30, 2008

(65) Prior Publication Data

US 2008/0310201 A1    Dec. 18, 2008

Related U.S. Application Data

(60) Provisional application No. 60/944,483, filed on Jun. 15, 2007.

(51) Int. Cl.
*H02M 5/42* (2006.01)
*G05F 1/40* (2006.01)
(52) U.S. Cl. .................. 363/89; 323/222; 323/283
(58) Field of Classification Search ............ 363/89; 323/222, 282–285
See application file for complete search history.

(56) References Cited

U.S. PATENT DOCUMENTS

| 7,148,669 B2* | 12/2006 | Maksimovic et al. | 323/283 |
| 7,479,772 B2* | 1/2009 | Zane et al. | 323/272 |
| 2006/0043954 A1* | 3/2006 | Markowski | 323/283 |
| 2008/0164859 A1* | 7/2008 | Peng et al. | 323/318 |

* cited by examiner

*Primary Examiner* — Jessica Han
(74) *Attorney, Agent, or Firm* — Hamilton DeSanctis & Cha LLP; Thomas J. Osborne, Jr.

(57) ABSTRACT

A digital PFC (DPFC) control approach that requires no input voltage sensing or current loop compensation is described. The approach can provide stable, low-harmonic operation over a universal input voltage range and load ranging from high-load operation in continuous conduction mode down to near-zero load. A fast voltage loop can also be incorporated into a DPFC controller to provide additional control of the power stage. A controller can be based on low-resolution DPWM and A/D converters, can be implemented without microcontroller or DSP programming, and is well suited for simple, low-cost integrated-circuit realizations.

26 Claims, 12 Drawing Sheets

DIGITAL POWER FACTOR CORRECTION

CROSS-REFERENCE TO RELATED APPLICATIONS

This application claims the benefit of U.S. provisional application No. 60/944,483, filed 15 Jun. 2007, which is hereby incorporated by reference as though fully set forth herein.

BACKGROUND OF THE INVENTION a. Field of the Invention

The instant invention relates to digital power factor control of analog current (AC) to direct current (DC) converters.

b. Background

Power factor correction (PFC) boost rectifiers are used in a wide range of applications to limit harmonic current emissions, such as those that are required to meet the IEC EN61000-3-2 standard. At low-to-medium power levels, a transition-mode control (i.e. critical conduction mode, or operation at the boundary of continuous conduction mode (CCM) and discontinuous conduction mode (DCM)), which offers simplicity and performance advantages, is widely used and supported by a range of commercially available low-cost controllers. At higher power levels (typically above several hundred Watts), CCM operation is often preferred because of lower conduction losses and reduced EMI filtering requirements. Averaged current mode control in combination with a slow voltage control loop and a multiplier, which is a well-known control approach for CCM PFC, requires a more complex implementation compared to the transition-mode control. With the motivation of simplicity comparable to transition-mode or DCM operation, together with low-harmonic, low conduction loss, and low EMI performance in CCM, the nonlinear-carrier (NLC) control technique was introduced in Maksimovic et al., Nonlinear-Carrier Control for High-Power-Factor Boost Rectifiers, Power Electronics, IEEE Transactions on, Volume 11, Issue 4, July 1996, pp. 578-84 and in U.S. Pat. No. 5,867,379 entitled "Non-Linear Carrier Controllers for High Power Factor Rectification," filed by Dragan Maksimovic et al., and issued on Feb. 2, 1999. This technique eliminated the needs for input voltage sensing, current loop compensation, and a precision analog multiplier. Variations of the analog NLC control approach have also been reported and used in commercially available controllers. Digital PFC controllers, offering improved system interface, power management features, support for multi-module operation, and improved voltage-loop dynamic responses, have recently received increased attention. However, most of the digital PFC control techniques reported so far have been based on DSP or microcontroller implementations, or have relied on multiple current samples per switching period.

BRIEF SUMMARY

A digital power factor correction (DPFC) controller and control system is provided. The DPFC controller and control system utilizes a digital current control scheme that enables CCM operation without input voltage sensing. The DPFC controller and control system provides advantages over analog systems and other proposed DPFC controllers of fast voltage loop control, programmability, and system interface as well as the opportunity for low-cost integrated circuit realizations based on very low digital hardware requirements, such as a low clock rate and a low resolution digital pulse-width-modulator (DPWM) and analog-to-digital (A/D) converter without the need for microcontroller or DSP programming.

In one implementation, a digital power factor correction (DPFC) controller for controlling a rectifier power converter is provided. The DPFC controller comprises a rectifier power stage current sampling input and an analog-to-digital converter for converting a power stage current input signal received via the rectifier power stage current sampling input to a digital current sample signal. The DPFC controller further comprises a control module that derives a digital power control signal u and generates a duty cycle command based upon the digital current sample signal and the digital power control signal u. The control module derives the digital power control signal u and generates the duty cycle command without sampling a signal proportional to an AC line voltage or a rectified AC line voltage. The DPFC controller also comprises a pulse-width-modulator for generating a pulse-width-modulated control signal for controlling a switching transistor of the rectifier power converter based upon the duty cycle command.

In another implementation, a method of controlling a rectifier power converter is also provided. The method comprises sampling an analog rectifier power stage current input signal; converting the analog rectifier power stage current input signal to a digital current sample signal; deriving a digital power control signal u without sampling a signal proportional to an AC line voltage or a rectified AC line voltage; generating a duty cycle command based upon the digital current sample signal and the digital power control signal u without sampling a signal proportional to the AC line voltage or the rectified AC line voltage; and generating a pulse-width-modulated control signal for controlling a switching transistor of the rectifier power converter based upon the duty cycle command.

The foregoing and other aspects, features, details, utilities, and advantages of the present invention will be apparent from reading the following description and claims, and from reviewing the accompanying drawings.

DETAILED DESCRIPTION OF THE INVENTION

I. Digital Power Factor Correction Controller

Figure 1:
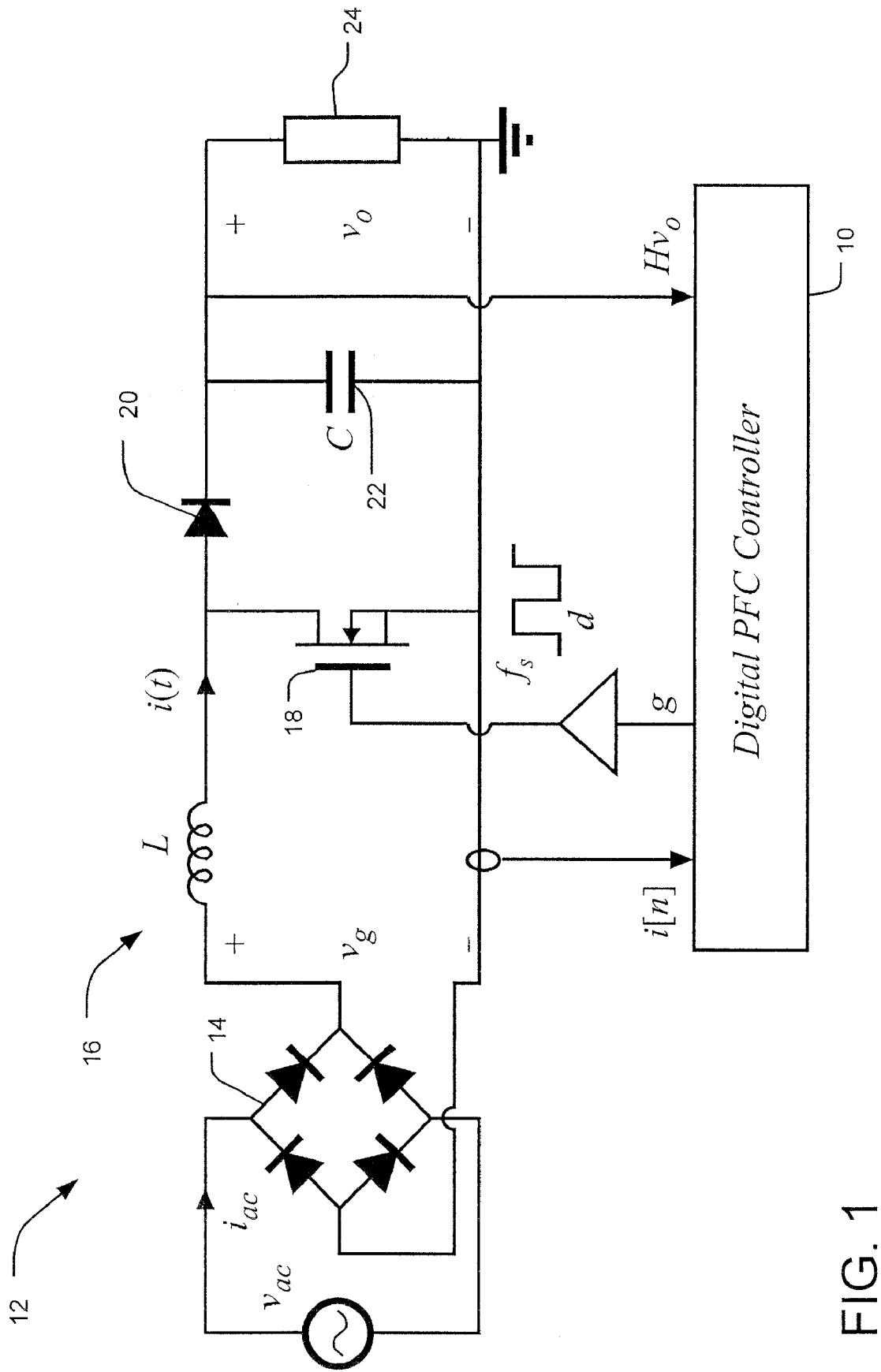
FIG. 1 depicts a block diagram of a digital power factor correction (DPFC) controller used to control the operation of a boost rectifier.

FIG. 1 shows a block diagram of a digital power factor correction (DPFC) controller 10 used to control the operation of a boost rectifier 12. In the circuit shown in FIG. 1, the boost rectifier 12 includes a rectifier circuit 14 and a boost converter 16. The rectifier circuit 14 rectifies an input AC voltage $v_{ac}$ to a rectified input voltage $v_g$, which is applied to the boost converter 16. The boost converter 16 includes an inductor L, a switching transistor 18, a diode 20, and an output capacitor 22. The boost converter 16 provides an output voltage $v_o$ to a load 24. In one embodiment, for example, a universal input voltage range of $V_o$=380V, an inductor L of 1 mH, a capacitor C of 230 µF, an FCP20N60 transistor, a 15ETX06 diode, a switching frequency of 100 KHz, and a maximum power of 1 KW can be used for the DPFC controlled boost rectifier shown in FIG. 1.

The DPFC controller 10 receives inputs from the boost converter 16 and controls the operation of the switching transistor 18 to control the output voltage $v_o$ of the boost converter 16. In the embodiment shown in FIG. 1, for example, the DPFC controller samples the output voltage $v_o$ and an inductor current i(t). The DPFC controller 10 generates a duty cycle command d that is used to provide a pulse-width-modulated signal g to a gate of the switching transistor 18 to control the operation of the switching transistor 18 in the boost rectifier 12.

The DPFC controller 10 may be implemented in a number of different configurations. The DPFC controller 10, for example, may sample other power-stage current signals than the inductor current i(t), such as a transistor switch current or a diode current. The sampled power-stage current (e.g., an inductor, transistor, or diode current) may be analog-to-digital (A/D) converted in any number of known A/D conversion techniques, such as using one or more of the following techniques: sampling a current signal in the middle of a switch on-time, once per switching period; sampling a current signal in the middle of the switch off-time, once per switching period; and/or sampling a current signal once or more than once per switching period. The digital pulse-width-modulation may be implemented using trailing edge modulation, leading edge modulation, or triangular-wave or dual-edge modulation techniques. A digital pulse-width-modulator can be realized using any known DPWM circuit technique, such as a counter-based DPWM, a delay-line based DPWM, a hybrid DPWM, or an analog PWM preceded by a digital-to-analog (D/A) converter. Voltage A/D conversion may utilize uniform, non-uniform, or programmable quantization characteristics. Sampling and/or A/D conversion of the output voltage can be performed once per switching period, at a lower rate, or at a higher rate.

A system reference voltage value used to compare to the output voltage can be preprogrammed or dynamically programmed through a digital input. There are numerous options that can be used to construct a voltage A/D converter and a system reference value, such as the following two architectures: a window A/D converter centered around an analog reference voltage $V_{ref}$, where $V_{ref}$ can be digitally programmed, such as through a digital-to-analog (D/A) converter; or an A/D converter with a conversion range set by an analog reference voltage. In the second configuration, for example, the system reference can be a direct digital input.

A digital error signal (i.e., a digital equivalent of a difference between the sensed output voltage $v_o$ and a reference voltage can be processed in a number of ways, such as a combination of one or more of the following functional blocks: a linear discrete-time compensator, such as an I, PI, or PID compensator; a nonlinear discrete-time compensator; a notch, comb, or other ripple-cancellation filter; linear or nonlinear processing of a combination of sampled voltage and sampled current signals; linear or nonlinear processing of power stage signals to achieve fast responses to changes in load or input voltage; processing blocks such as dither or sigma-delta modulators to improve effective system resolution; blocks that facilitate auto-tuning of controller parameters; and diagnostic blocks that facilitate system design (e.g., in a CAD environment) or improve system robustness or reliability.

The boost converter 16, for example, may be operated in continuous conduction mode (CCM), discontinuous conduction mode (DCM), or a combination of CCM and DCM. Although the DPFC 10 is shown with a boost converter, the DPFC may also be used with other power converters, such as but not limited to bridgeless boost, buck boost, flyback, or other converter topologies, or with a combination of multiple PFC converter modules operating in parallel.

With reference to FIG. 1, in a PFC rectifier the current control objective can be written as: $i_g = v_g / R_e$, where $v_g$ is the rectified line voltage, $i_g$ is the low-frequency (average) component of the inductor current, and $R_e$ is an emulated resistance, $R_e = V_{g,rms}^2 / P$ (P is the input power). Using a quasi-static relationship for the CCM boost converter, $V_{out}(1-d) = v_g$, where d is the switch duty ratio, the current control objective can be expressed as:

$$i_g = \frac{V_{out}}{R_e}(1-d) = \frac{V_{out} P}{V_{g,rms}^2}(1-d) = \frac{1}{u}(1-d) \quad (1)$$

where u takes the role of a power control signal. In analog NLC approaches, the equation (1) is solved using a voltage comparator by constructing a carrier waveform based on $d \to t/T_s$. A different approach, well suited for digital realization, follows by solving equation (1) for the duty cycle command d[n] directly as a function of the current sample $i_g[n]$, $$d[n]=1-ui_g[n]=1-ui[n] \quad (2)$$

where i[n] represents a sample of the inductor current, ideally in the middle of the switch on-time or in the middle of the switch off-time, and u is the power control signal. However, the inductor current may also be sampled at other times, such as at any point during the switch on-time or off-time when the switch is not undergoing a transition in order to reduce noise associated with a switch transition.

More generally, for a switched-mode converter having a conversion ratio $M(d) = V_{out}/v_g = P(d)/Q(d)$, where d is the switch duty ratio and P(d), Q(d) are polynomials in d, the control objective $i_g = v_g/R_e$ can be expressed as $i_g = (Q(d)/P(d)) V_{out}/R_e$, or:

$$uP(d[n])i_g[n]=Q(d[n]) \quad (2a)$$

A solution of Equation (2a) in terms of d[n] leads to a control law. For example, in a boost converter, P(d)=1, and Q(d)=1−d, which from Equation (2a) gives the control law (2). As another example, in a buck-boost converter P(d)=d, and Q(d)=1−d, which according to (2a) gives a control law for the buck-boost converter:

$$d[n] = \frac{1}{1+ui_g[n]} \quad (2b)$$

The same principle can be easily applied to derive appropriate control laws for other converters, or for other current sensing options.

Equation (2) is the basic version of a proposed DPFC current control law for the DPFC controller 10 shown in FIG. 1. Note that equation (2) requires no input voltage sensing or compensation in the current control loop.

Figure 2:
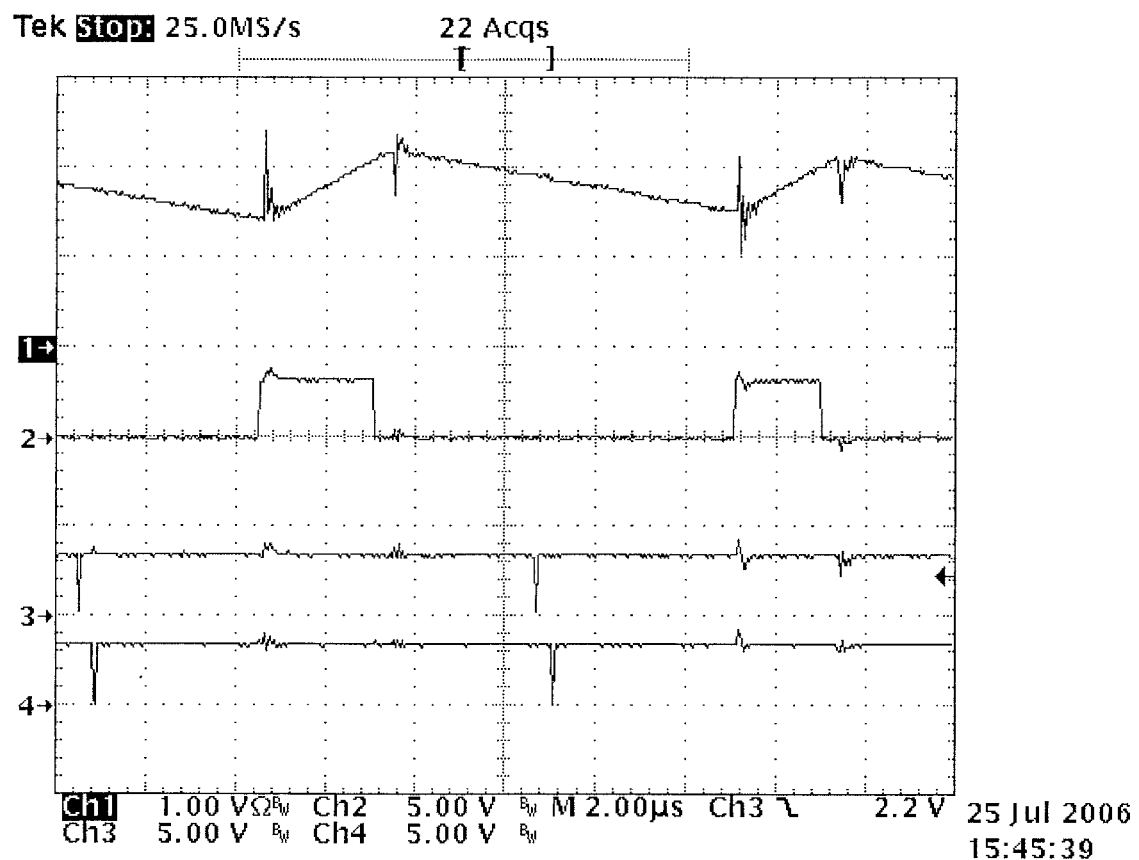
FIG. 2 illustrates an operation of an example of a DPFC controller.

FIG. 2 illustrates an example operation of a DPFC controller based on equation (2). The current A/D conversion start ($\overline{\text{CONVST}}$) and end of conversion (EOC) signals of this example show that the inductor current is sampled in the middle of the switch off time and the duty cycle is updated based on the current sample.

A. Stability

The mode of operation for the boost PFC can be determined from the parameters K and $K_{crit}$ as shown in equations (3) and (4).

$$K = \frac{1}{1 - \frac{v_g(t)}{V_{out}}}; \quad (3)$$

$$K_{crit} = \frac{R_e T_s}{2L} \quad (4)$$

Figure 3:
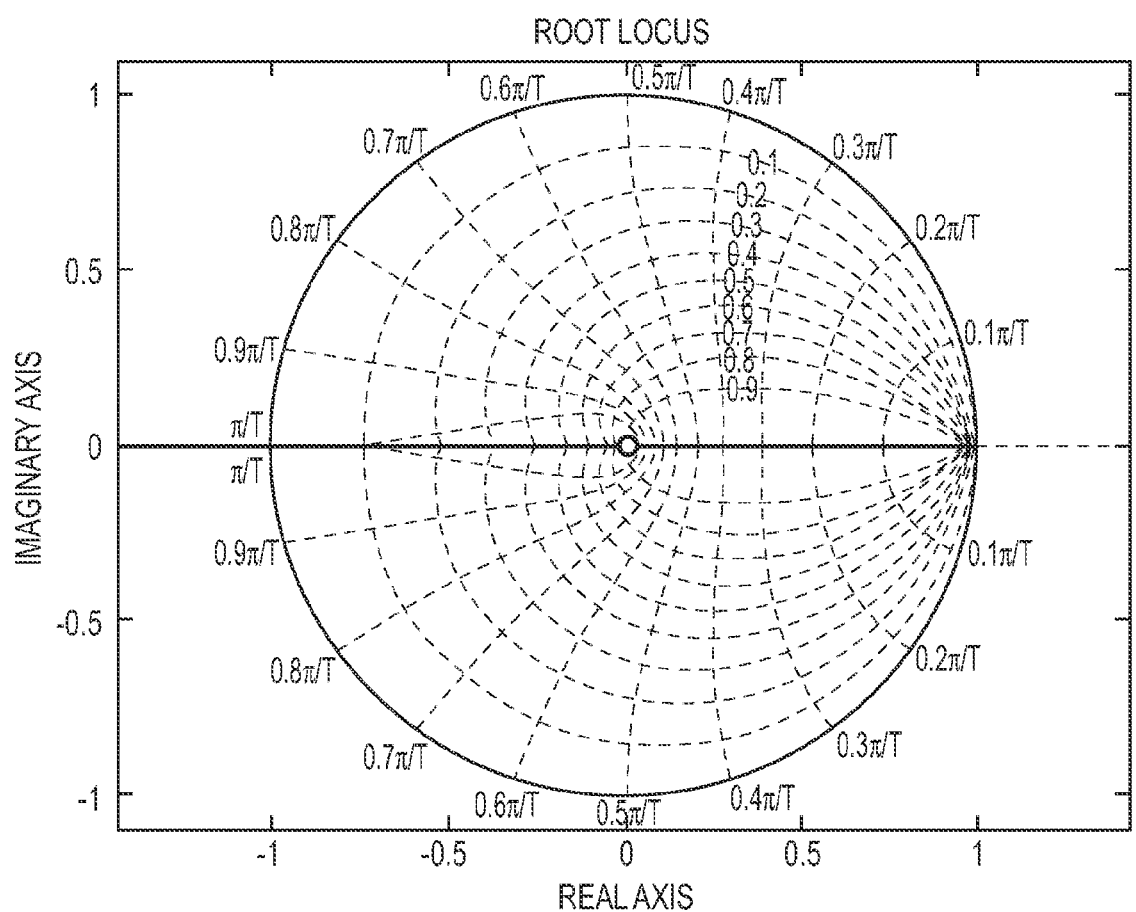
FIG. 3 depicts a root locus plot for a first example of a current control law for a DPFC controller.

The minimum value of K occurs when the line voltage is equal to zero, during the zero crossing of the input voltage sinusoid. At this point $K=K_{min}=1$. To insure that the converter is operating in CCM during the entire line cycle, $K_{crit}$ can be less than $K_{min}$; $K_{crit}<1$ in order to ensure that the converter is operating in CCM during the entire line cycle. Investigating the boost dynamics for the current control law in equation (2) it is found that the root locus plot of T(z) for the system is as shown in FIG. 3. The single pole starts at the intersection of the positive real axis and the unit circle and as K increases, traverses to the intersection of the negative real axis and unit circle. The loop gain transfer function becomes unstable for values of $K_{crit}>1$.

Figure 4:
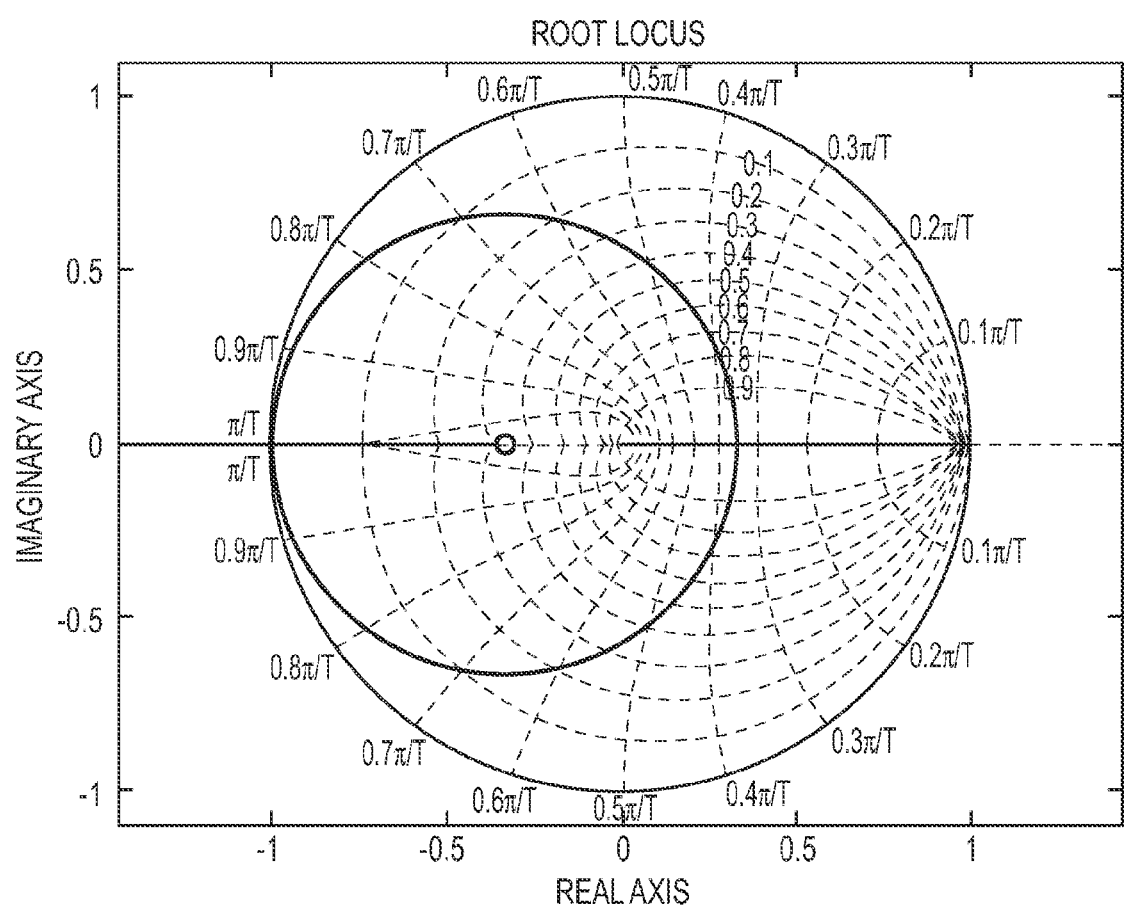
FIG. 4 depicts a root locus plot for a second example of a current control law for a DPFC controller.

Modifying the control law as shown in equation (5), $$d[n]=1-ui_g[n]=1-u(\alpha i[n]+(1-\alpha)i[-1]) \quad (5)$$

however, results in the root locus plot for T(z) shown in FIG. 4. By using this modified control law, the two poles move towards each other until they meet. Then, the poles become a complex conjugate pair and arc towards the unit circle. The placement of the zero determines the movement of the complex conjugates and is determined by α. The maximum stable $K_{crit}$ value is attained when α=0.75. When using this optimal value the loop gain of the system is now stable and operates in CCM during the entire line cycle for all values of $K_{crit}<2$. This effectively extends the range of stable operation from $K_{crit}<1$ to $K_{crit}<2$, meaning that the load range for which the converter operates in CCM during the entire line cycle has been increased to include lower power levels. The stable range of $K_{crit}$ can be further extended by the adding more samples of prior values of the inductor current to the current control law weighted with more coefficients (β, γ, etc.).

B. Operation at Light Loads

At light loads the converter will operate in DCM during the entire input voltage line cycle and the power level command will saturate at $u_{max}=0.5$. To maintain voltage regulation in light load conditions a further modification can be added to the current control law as shown in equation (6).

$$d[n]=d_{max}-ui_g[n] \quad (6)$$

The previously modified control law shown in equation (5) could also be modified in the same manner. The new variable, $d_{max}$, is reduced during low power operation when $u=u_{max}$. When $u \neq u_{max}$, $d_{max}$ is equal to 1. By reducing $d_{max}$ the power delivered to the output is reduced due to reduced switch on-time. Voltage regulation is possible down to very light loads even for high input voltage levels. When the system is operating such that $d_{max}<1$ the line current THD is increased. The same control loop that generates the u signal is also used to generate $d_{max}$, with saturation limits imposed on both signals so that $d_{max}=1$ while $0<u<0.5$ and $u=0.5$ when $d_{max}<1$.

II. Voltage Regulation

The voltage regulation requirements for PFC controllers are unique in that there is significant ripple present in the output voltage at twice the input line frequency. This ripple cannot be eliminated through regulation without compromising the very purpose of the boost preregulator. One common approach is to design a low bandwidth voltage control loop to provide significant attenuation of the ripple at twice the line frequency.

A. Slow Voltage Loop

Figure 5:
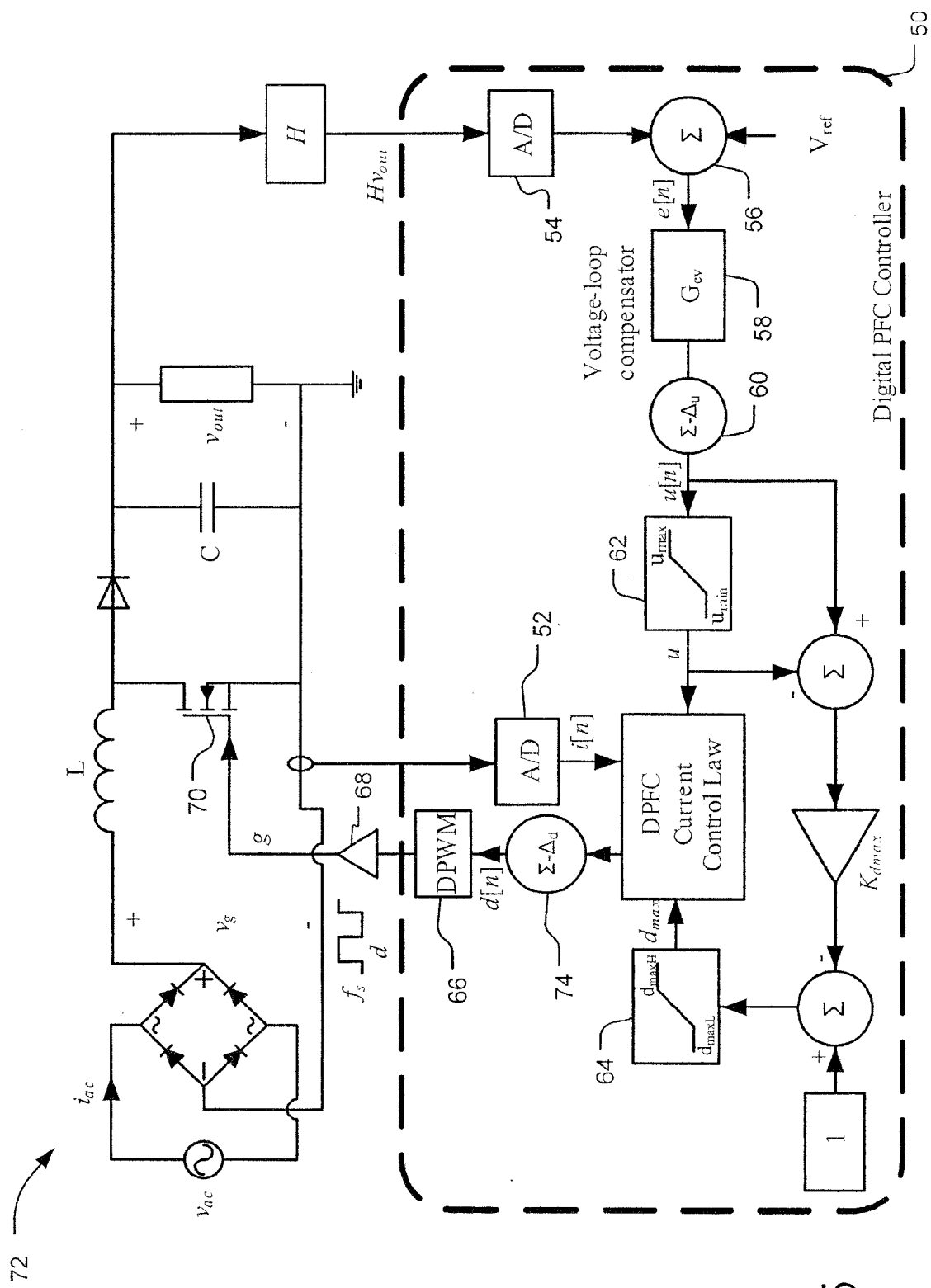
FIG. 5 depicts a block diagram of a second embodiment of a DPFC controller including an example of a slow voltage control loop.

The control to output transfer function of the boost preregulator was modeled as an ideal rectifier. FIG. 5 shows the resulting small signal model of the boost preregulator when the current control law shown in equation (2) is implemented.

The DPFC controller 50 shown in FIG. 5 provides a standard slow loop voltage loop controller based on a simple integral compensator. The DPFC controller 50 samples an inductor current i(t) and an output voltage $Hv_o$ are sampled by the DPFC controller 50. The inductor current i(t) is passed through an analog-to-digital (A/D) converter 52 to provide a digital sampled inductor current i[n]. The output voltage $Hv_o$ is passed through an A/D converter 54 to provide a digital sampled output voltage. The digital sampled output voltage is compared to a reference voltage $V_{ref}$ at summing node 56 to provide a digital error signal e[n]. Alternatively, an analog output voltage signal may be applied to a summing node to obtain an analog error signal e(t) that could then be passed through an A/D converter to obtain the digital error signal e[n]. The digital error signal e[n] is passed through a voltage loop compensator 58 having a transfer function $G_{cv}$. The voltage loop compensator computes a power control signal u[n]. As described above, as the power is reduced, the command u[n] saturates at $u_{max}=0.5$ for formula (2) described above. Control through $d_{max}$ then enables power control down to a zero load. In one particular implementation, the power control signal u[n] can be passed through a sigma-delta (Σ-Δ) modulator 60, which can be very effective in improving an effective resolution of the power control signal u[n].

The power control signal u[n], either after undergoing Σ-Δ modulation or not, is provided to a limiter 62. A lower limit $u_{min}$ effectively sets an upper power limit. An upper limit $u_{max}$, such as $u_{max}=0.5$, sets a power value under which control through $d_{max}$, for example as shown in Equation (6), becomes effective for power levels. As shown in the example of FIG. 5, at low power levels, the difference between u[n] and $u_{max}$ is provided to a control path via gain $K_{dmax}$ to set $d_{max}$, which can further pass through a limiter 64 to restrict the range of $d_{max}$ if so desired, such as between limits $d_{maxL}$ and $d_{maxH}$ shown in FIG. 5.

The power control signal u[n], the sampled inductor current i[n], and the maximum duty cycle command $d_{max}$ are then manipulated to provide a duty control command d[n]. The duty cycle command is then applied to a digital pulse-width-modulator (DPWM) 66 that provides a pulse-width-modulated gate control signal g through an amplifier 68 to a gate of a switching transistor 70 of a boost rectifier 72. Again, the duty cycle command d[n] may also be passed through a Σ-Δ modulator 74 that can improve an effective resolution of the duty cycle command d[n].

In one implementation of the boost rectifier with a DPFC controller shown in FIG. 5, for example, the rectifier may include a universal input voltage range, an output voltage $V_o$=380 V, an inductor L=1 mH, a capacitor C=230 μF, an FCP20N60 power transistor, an 15ETX06 diode, a switching frequency of 100 KHz, and a maximum power of 500 W.

Figure 6:
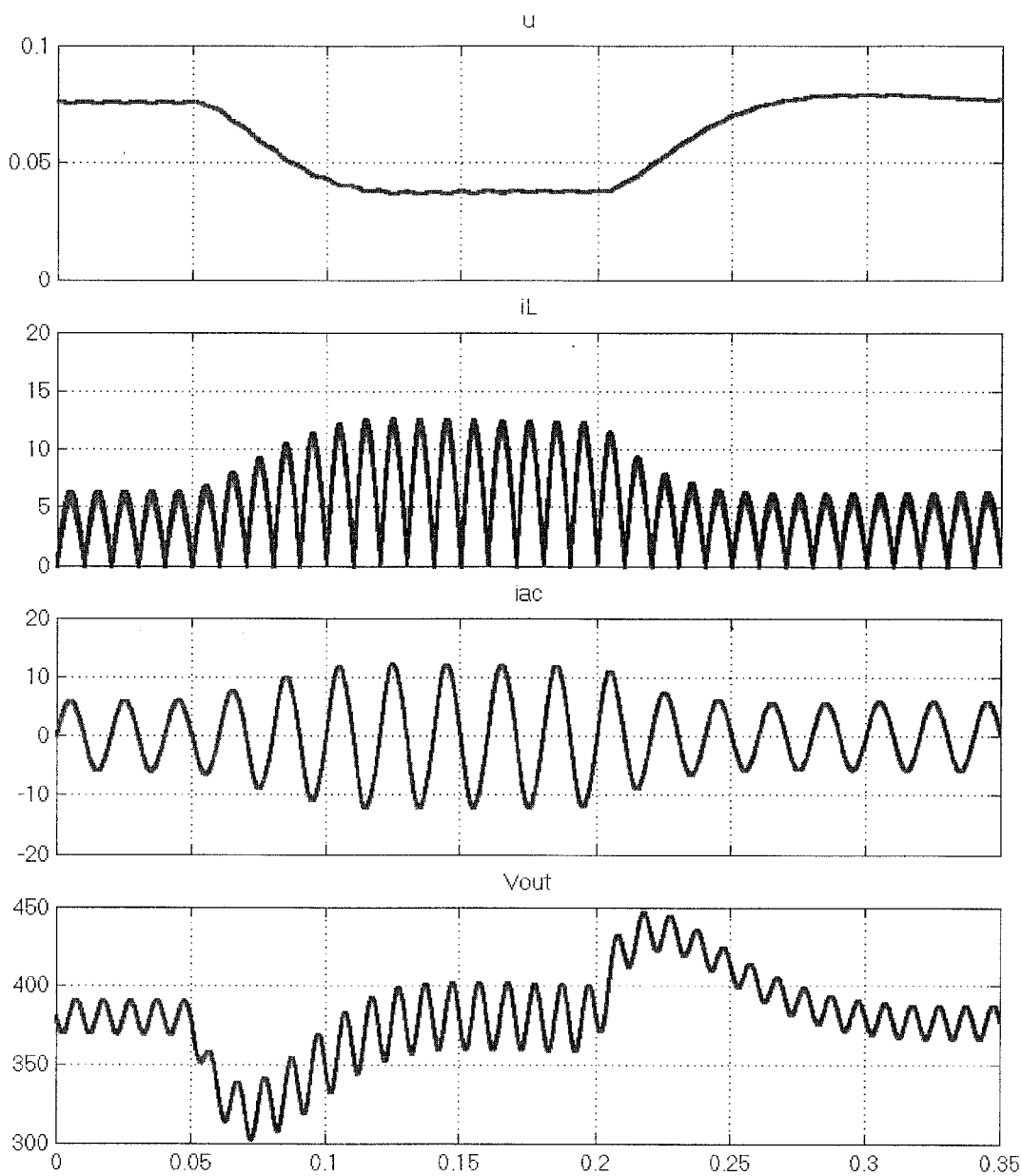
FIG. 6 depicts simulated waveforms for an example implementation of the DPFC controller of FIG. 5.

Simulated waveforms for an example implementation of the DPFC controller 50 are shown in FIG. 6 for a 500 W to 1 KW step load transient. In this particular implementation, the maximum voltage variation from a nominal output voltage $V_o$=380 V is 80 V.

A slow voltage-loop compensator $G_{cv}$, for example a linear PI compensator, can be designed using standard techniques assuming worst-case operating conditions. Another approach would include an adaptively adjusted compensator gain that would depend on the power setting variable (u) in such a way that the bandwidth is kept relatively constant as the power level changes.

B. Fast Voltage Loop

Figure 7:
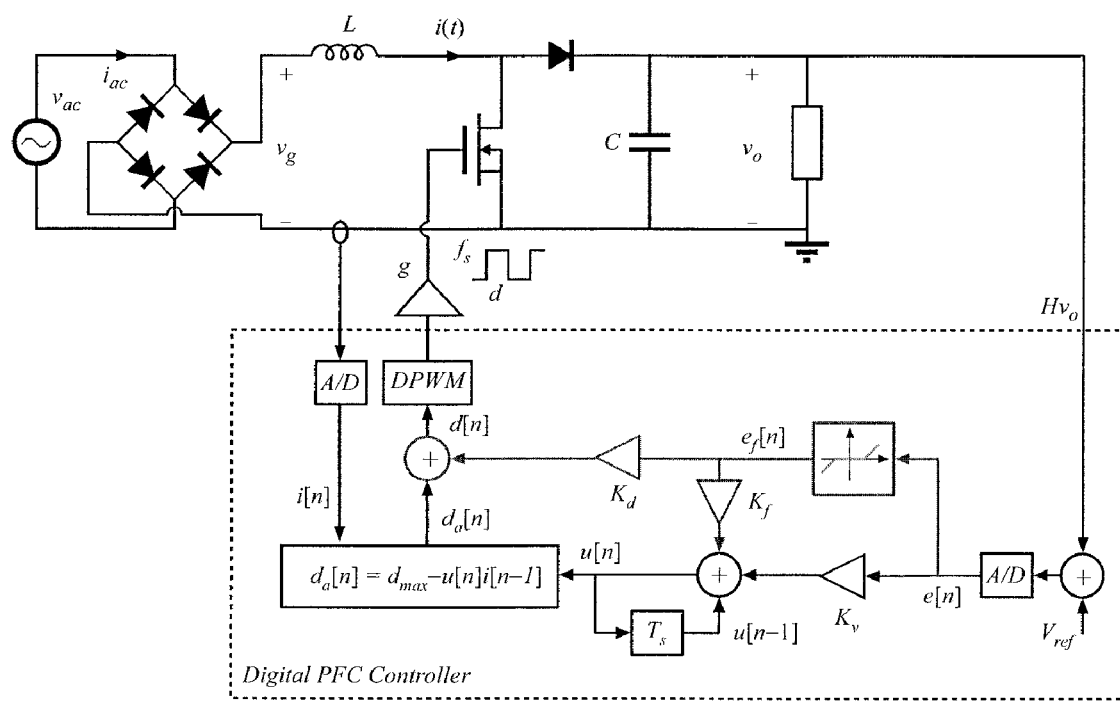
FIG. 7 depicts a block diagram of a third embodiment of a DPFC controller including an example of a fast voltage control loop.

One advantage of a DPFC implementation is the ease of including a fast voltage loop to allow greater voltage regulation during transients. FIG. 7 shows a fast voltage loop control scheme. The dead-zone approach is a modification of a technique presented in A. Prodić, D. Maksimović, R. W. Erickson, "Dead-zone digital controllers for improved dynamic response of low harmonic rectifiers," *IEEE Trans. on Power Electron.*, vol. 21, no. 1, pp. 173-181, January 2006, which is hereby incorporated by reference as though fully set forth herein, and is easily implemented using the quantization bins of the output voltage sensing ADC.

When the dead-zone is not active, the output voltage is within the dead-zone, the control loop is identical to slow voltage loop where $K_i$ denotes the integral gain of the slow voltage loop. In this particular implementation, the dead-zone is set such that it is not active during steady-state operation. This implies that the dead-zone must be set larger than the twice the line frequency voltage ripple present on the output voltage. During a transient, the output voltage will exceed the dead-zone and the fast voltage loop will become active. The fast voltage loop enables the integral gain parameter $K_f$, effectively increasing the speed at which u or $d_{max}$ updates. The duty cycle command is also directly modified via parameter $K_d$ which adds to the improvement of the dynamic response of the converter during transients.

Figure 8:
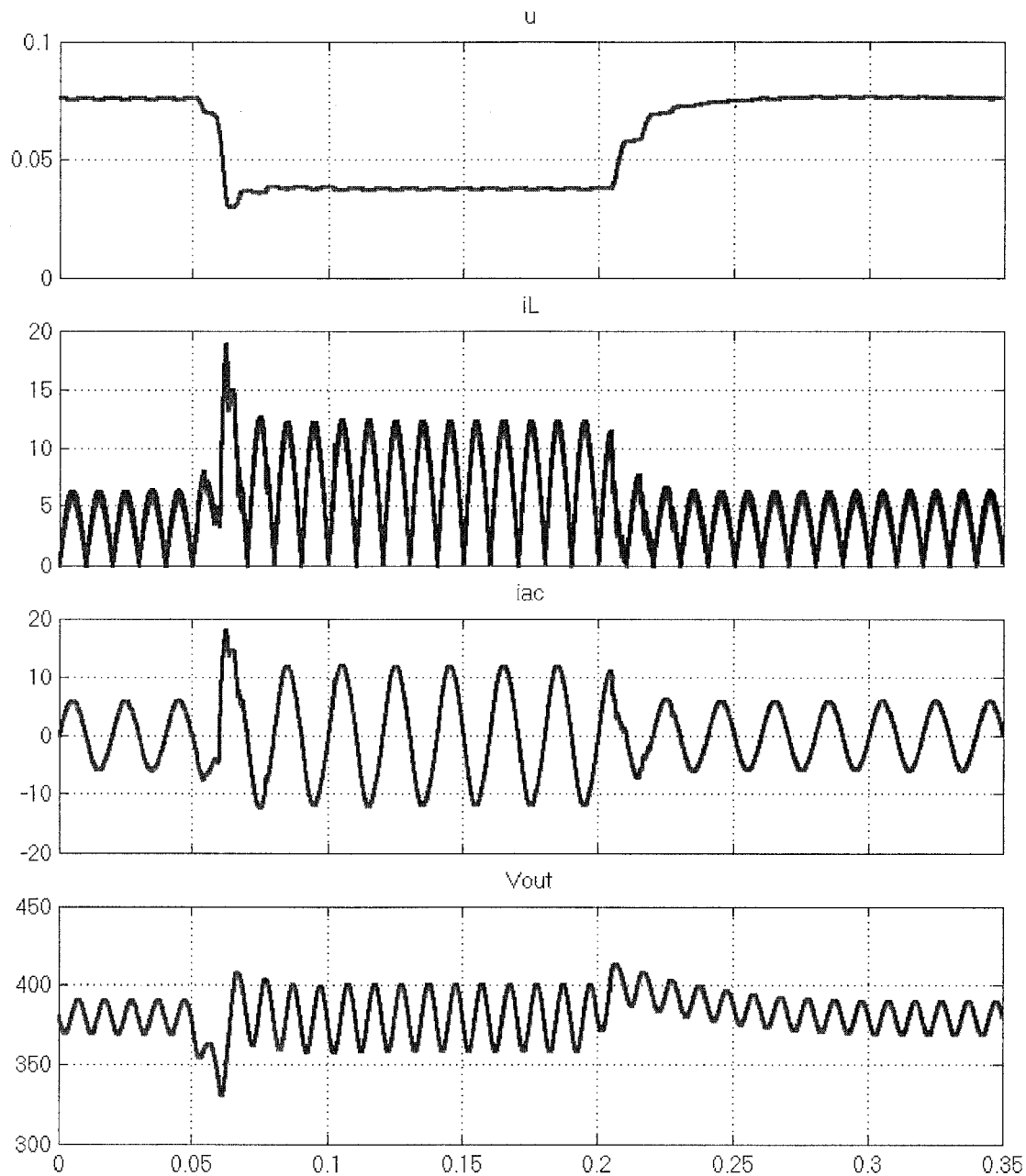
FIG. 8 depicts simulated waveforms for an example implementation of the DPFC controller of FIG. 7.

FIG. 8 shows a simulation of a load transient (500 W to 1000 W and back to 500 W) with and without the fast voltage loop enabled. The output voltage overshoot and undershoot was reduced 29.7 V and 24.4 V respectively. One advantage of tighter output voltage regulation would be a narrower input voltage range for downstream converters. It is also possible that certain applications would not require downstream converters if a modest level of output voltage regulation were required.

III. Example System Implementation

An experimental prototype includes a boost rectifier power stage and a digital controller implemented using a Xilinx FPGA development platform. The digital controller allows experimentation with the resolutions of current sensing (up to 8-bit, 33 mA current LSB resolution), voltage sensing (up to 8-bit, 3 V LSB output voltage resolution), and the digital pulse-width modulator (up to 9-bit DPWM). The input voltage range is 90-260 Vrms and the nominal output voltage is 380V. The maximum designed power rating is 1 kW and the switching frequency is 100 kHz.

A. Quantization Issues

In this example, one objective was to meet EN61000-3-2 standards with the simplest digital implementation possible to yield a cost effective PFC controller and reduce the number of connection needed to interface the controller. The effects of various resolutions of the DPWM and the current sensing ADC were investigated to this aim.

i. DPWM Resolution

The resolution of the DPWM was variable from 9-bits to 1-bit. During experimentation it was determined that the 2-bit and 1-bit settings were simply not feasible and represented extreme quantization effects. Implementing Σ-Δ modulation (see First-order Σ-Δ modulation below) for the duty cycle command signal labeled as d in FIG. 1 allowed the resolution to be lowered to as low as 3-bits while maintaining harmonic limit standards at a 1 kW power level. A DPWM setting of 4-bits, with Σ-Δ modulation implemented, was found to be a suitable setting for the operation of the converter.

ii. Current Sensing ADC Resolution

The current sensing ADC had a variable resolution of 8-bits to 3-bits. Table 1 shows how the changing the current sense resolution effects the THD of the line current. The current sensing resolution in mA/bit is also presented in Table 1. For this experiment the DPWM resolution was set to 4-bits of resolution and Σ-Δ modulation was enabled for both the u and d signals. The current resolution is as high as 1 A in the case of a 3-bit current sense ADC, however, at 500 W the harmonic current limits are not exceeded.

TABLE 1

Effects of current sense resolution for power, P = 500 W, and a 4-bit DPWM

| Current A/D Resolution (bits) | Current A/D Resolution (mA/bit) | $V_g$ = 120 $V_{rms}$ THD (%) | $V_g$ = 220 $V_{rms}$ THD (%) |
|---|---|---|---|
| 8 | 33 | 4.3 | 2.3 |
| 7 | 65 | 4.4 | 2.4 |
| 6 | 130 | 4.7 | 2.7 |
| 5 | 260 | 5.3 | 3.5 |
| 4 | 521 | 6.1 | 5.4 |
| 3 | 1042 | 8.1 | 9.1 | iii. First-Order Σ-Δ Modulation

Figure 9:
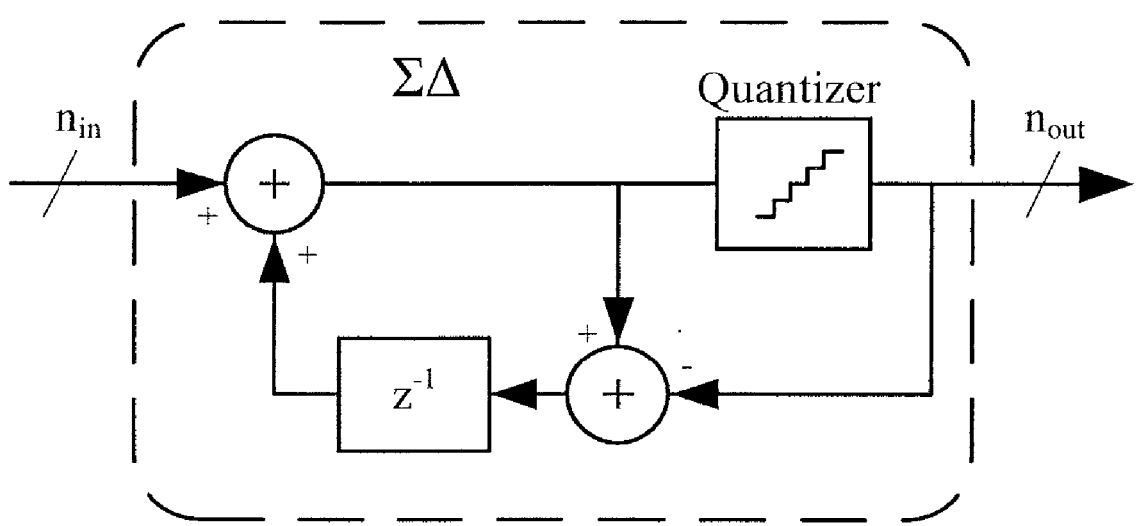
FIG. 9 depicts an example diagram for a $1^{st}$ order $\Sigma$-$\Delta$ modulation scheme for reducing a 8-bit signal to a 4-bit signal.

First-order Σ-Δ modulation can be used to implement dithering of the power level signal (u) and the duty cycle setting (d). FIG. 9 shows a basic diagram for a $1^{st}$ order Σ-Δ modulation scheme for reducing a 8-bit signal to a 4-bit signal. The four unused LSBs are added to the 8-bit input on the next clock cycle. It is useful to note that the low resolution output (4-bits in this case) will change by a maximum of 1 LSB due to the introduction of dithering. The rate at which dithering occurs depends on how closely matched the high resolution input signal is to the low resolution output signal concatenated with zeros for each dithering bit (LSBs). The maximum rate of dithering is half the clocking frequency, which would occur when the high resolution input is exactly between adjacent values attainable by the low resolution output.

The signal u effectively sets the power level the converter is operating. At high power levels the power differential between 1 LSB steps in u become considerably large; meaning that the resolution of power levels drops significantly compared to at lower power levels. Dithering is implemented to achieve a higher effective resolution in power levels for the u signal. At high power levels without dithering u there are significant sub-harmonic components leading to highly undesirable operation for a PFC.

Figure 10A:
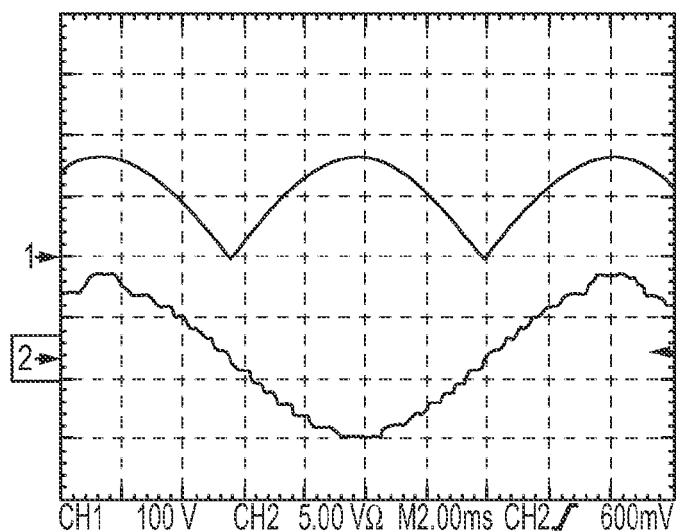
FIGS. 10A through 10C depict three converter line voltage and current waveforms for different dithering implementations.
Figure 10B:
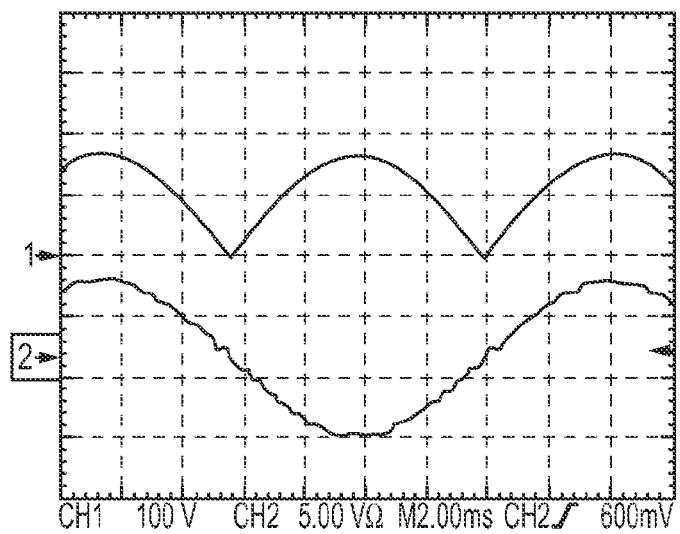
Figure 10C:
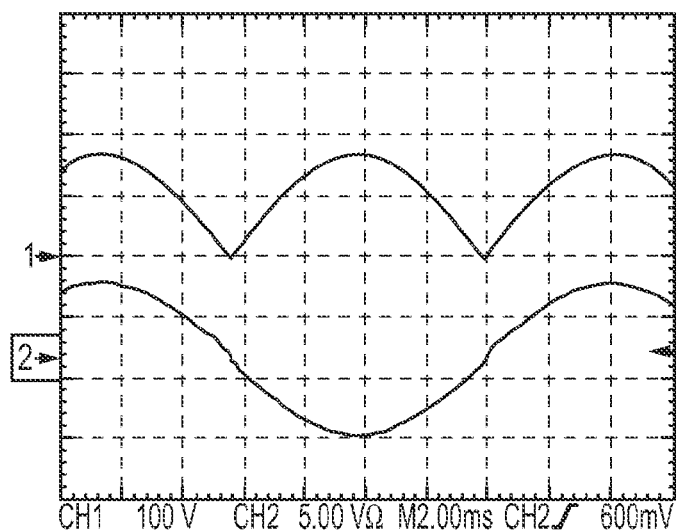
Figure 11:
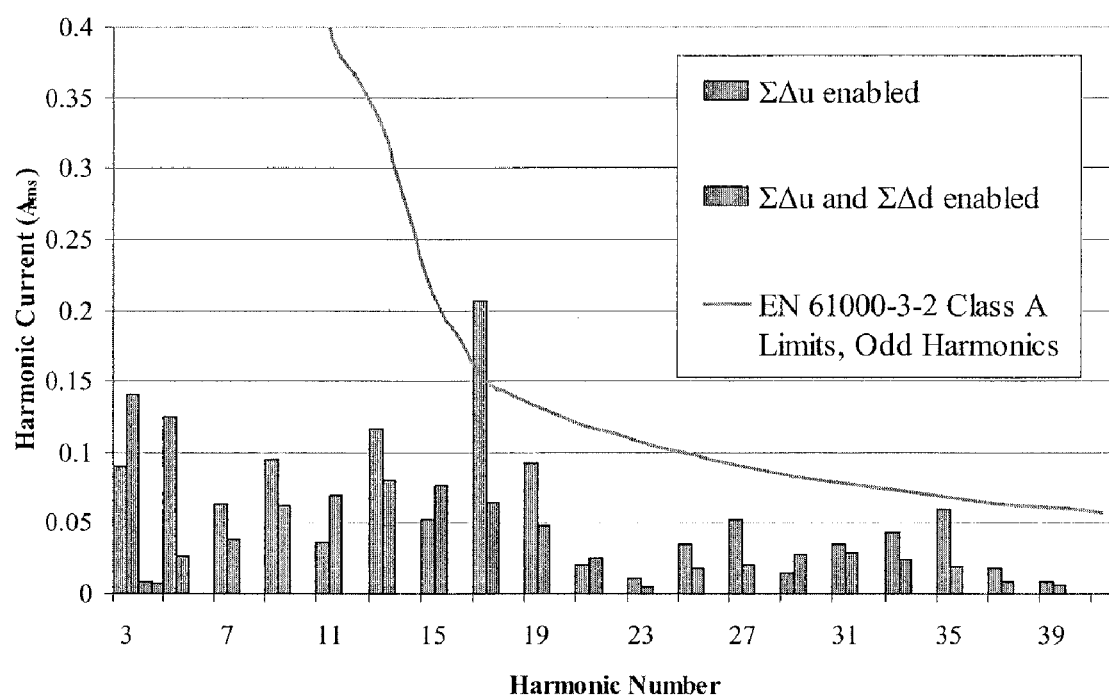
FIG. 11 depicts a plot of the harmonic currents for the same conditions as shown in FIG. 10.

A first-order Σ-Δ modulator can also be used for reducing the necessary resolution for the DPWM while maintaining EN61000-3-2 standards. FIGS. 10A, 10B, and 10C show three converter line voltage and current waveforms for different dithering implementations. In each of the FIGS. 10A through 10C, the converter power P=500 W and $V_{g,rms}$=120 $V_{rms}$ in a 4-bit DPWM with an 8-bit current sensing A/D converter. In FIG. 10A, for example, no Σ-Δ modulation is performed and undesirable subharmonic limit-cycling can be seen in the current waveform $i_{ac}$. In FIG. 10B, Σ-Δ modulation of the power control signal u is performed and improved resolution of the current waveform $i_{ac}$ can be seen relative to FIG. 10A. In FIG. 10C, however, Σ-Δ modulation is performed for both the power control signal u and the duty cycle command d. In FIG. 10C, undesirable subharmonic limit-cycling is removed under all operating conditions. With u and d dithering implemented FIG. 10c produces a clean waveform that easily meets harmonic current specifications. FIG. 11 is a plot of the harmonic currents for the same conditions as shown in FIG. 10. Harmonic current values are shown for both the u and d dithering and u dithering only settings. The Class A harmonic current limits for the odd harmonics are also shown. Without the dithering active the 3-bit DPWM is not capable of passing the harmonic current limits, with dithering the 3-bit DPWM easily passes the harmonic current limits. A total of six internal dithering bits (LSBs) were utilized for the 3-bit DPWM setting. It should be noted that second-order or higher-order Σ-Δ can also be used for effective resolution improvements.

B. Experimental Results

Figure 12:
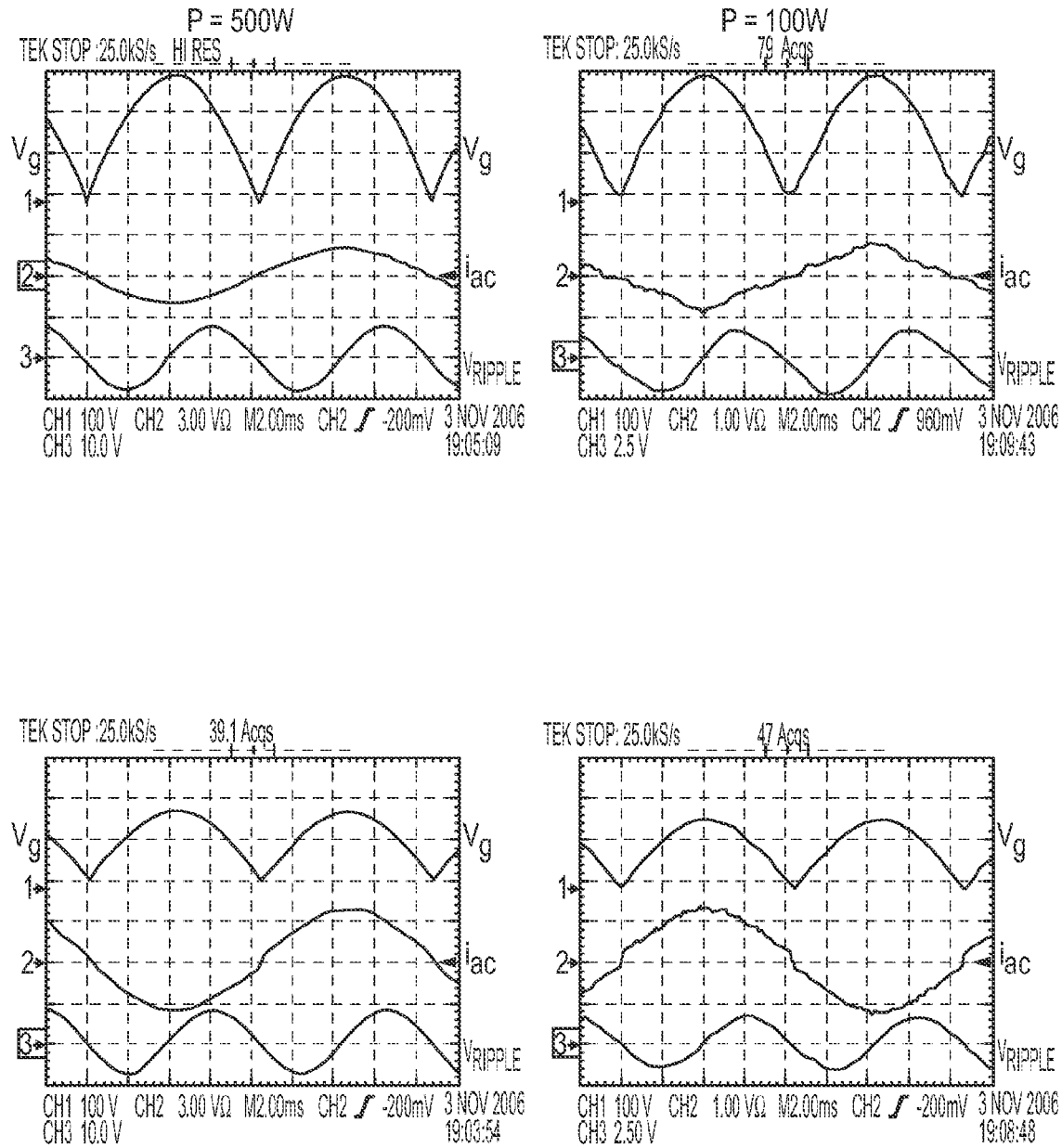
FIG. 12 depicts experimental converter waveforms for different line voltages and loads.

FIG. 12 shows an experimental line current ($i_{ac}$), the rectified line voltage ($v_g$) and the output voltage ripple ($v_{ripple}$) waveforms for different line voltages (220 $V_{rms}$ and 120 $V_{rms}$) and loads (500 W and 100 W) with a 4-bit DPWM and a 4-bit current sensing ADC. The Class A harmonic current limits are met for all operating conditions.

A digital PFC (DPFC) control approach that requires no input voltage sensing or current loop compensation is provided. The approach can provide stable, low-harmonic operation over a universal input voltage range and load ranging from high-load operation in continuous conduction mode down to near-zero load. A fast voltage loop can also be incorporated into a DPFC controller to provide additional control of the power stage. A controller can be based on low-resolution DPWM and A/D converters, can be implemented without microcontroller or DSP programming, and is well suited for simple, low-cost integrated-circuit realizations.

Although embodiments of this invention have been described above with a certain degree of particularity, those skilled in the art could make numerous alterations to the disclosed embodiments without departing from the spirit or scope of this invention. All directional references (e.g., upper, lower, upward, downward, left, right, leftward, rightward, top, bottom, above, below, vertical, horizontal, clockwise, and counterclockwise) are only used for identification purposes to aid the reader's understanding of the present invention, and do not create limitations, particularly as to the position, orientation, or use of the invention. Joinder references (e.g., attached, coupled, connected, and the like) are to be construed broadly and may include intermediate members between a connection of elements and relative movement between elements. As such, joinder references do not necessarily infer that two elements are directly connected and in fixed relation to each other. It is intended that all matter contained in the above description or shown in the accompanying drawings shall be interpreted as illustrative only and not limiting. Changes in detail or structure may be made without departing from the spirit of the invention as defined in the appended claims.

What is claimed is:

1. A digital power factor correction (DPFC) controller for controlling a rectifier power converter, the DPFC controller comprising:
   a rectifier power stage current sampling input;
   an analog-to-digital converter for converting a power stage current input signal received via the rectifier power stage current sampling input to a digital current sample signal;
   a control module that derives a digital power control signal u and generates a duty cycle command based upon the digital current sample signal and the digital power control signal u, wherein the control module derives the digital power control signal u and generates the duty cycle command without sampling a signal proportional to an AC line voltage or a rectified AC line voltage; and
   a pulse-width-modulator for generating a pulse-width-modulated control signal for controlling a switching transistor of the rectifier power converter based upon the duty cycle command.

2. The DPFC controller of claim 1 wherein the digital power control signal u is derived via a voltage compensator loop.

3. The DPFC controller of claim 2 wherein the voltage compensator loop comprises a rectifier power stage output voltage sampling input and an analog-to-digital converter for converting a power stage output voltage input signal received via the rectifier power stage output voltage sampling input to a digital output voltage sample signal.

4. The DPFC controller of claim 1 wherein the power stage current comprises an inductor current.

5. The DPFC controller of claim 1 wherein the power stage current comprises a switch current.

6. The DPFC controller of claim 1 wherein the power stage current comprises a diode current.

7. The DPFC controller of claim 1 wherein the DPFC controller is coupled to a boost converter stage of a boost rectifier.

8. The DPFC controller of claim 7 wherein the control module derives the digital power control signal μ based upon the following formula u=$R_e/V_{out}$, wherein $R_e$ denotes an emulated resistance of the boost converter and $V_{out}$ denotes a digital output voltage sample signal.

9. The DPFC controller of claim 7 wherein the control module derives the duty cycle command according to a control law d[n]=$d_{max}$−u(αi[n]+(1−α)i[n−1]), where $d_{max}$ is a function of u, 0≤$d_{max}$≤1, and 0≤α≤1.

10. The DPFC controller of claim 1 wherein the power stage current input signal is sampled during an off-time of a switching transistor of the rectifier power converter.

11. The DPFC controller of claim 10 wherein the power stage current input signal is sampled at approximately a middle of an off-time of a switching transistor of the rectifier power converter.

12. The DPFC controller of claim 1 wherein the power stage current input signal is sampled during an on-time of a switching transistor of the rectifier power converter.

13. The DPFC controller of claim 1 wherein the power stage current input signal is sampled at approximately a middle of an on-time of a switching transistor of the rectifier power converter.

14. A method of controlling a rectifier power converter comprising:
- sampling an analog rectifier power stage current input signal;
- converting the analog rectifier power stage current input signal to a digital current sample signal;
- deriving a digital power control signal u without sampling a signal proportional to an AC line voltage or a rectified AC line voltage;
- generating a duty cycle command based upon the digital current sample signal and the digital power control signal u without sampling a signal proportional to the AC line voltage or the rectified AC line voltage; and
- generating a pulse-width-modulated control signal for controlling a switching transistor of the rectifier power converter based upon the duty cycle command.

15. The method of claim 14 wherein the operation of generating the digital power control signal u comprises deriving the digital power control signal u via a voltage compensator loop.

16. The method of claim 15 wherein the operation of deriving the digital power control signal u further comprises sampling a rectifier power stage output voltage input and converting the sampled rectifier power stage output voltage input to a digital output voltage sample signal.

17. The method of claim 14 wherein the analog rectifier power stage current input signal comprises an inductor current of the rectifier power converter.

18. The method of claim 14 wherein the analog rectifier power stage current input signal comprises a switch current of the rectifier power converter.

19. The method of claim 14 wherein the analog rectifier power stage current input signal comprises a diode current of the rectifier power converter.

20. The method of claim 14 wherein the DPFC controller is coupled to a boost converter stage of a boost rectifier.

21. The method of claim 20 wherein the operation of deriving the digital power control signal u is based upon the following formula $u=R_e/V_{out}$, wherein $R_e$ denotes an emulated resistance of the boost converter and $V_{out}$ denotes a digital output voltage sample signal.

22. The method of claim 20 wherein the DPFC controller generates the duty cycle command according to a control law $d[n]=d_{max}-u(\alpha i[n]+(1-\alpha)i[n-1])$, where $d_{max}$ is a function of u, $0 \leq d_{max} \leq 1$, and $0 \leq \alpha \leq 1$.

23. The method of claim 14 wherein operation of sampling the analog rectifier power stage current input signal comprises sampling the analog rectifier power stage current input signal during an off-time of the switching transistor of the rectifier power converter.

24. The method of claim 23 wherein operation of sampling the analog rectifier power stage current input signal comprises sampling the analog rectifier power stage current input signal at approximately a middle of an off-time of the switching transistor of the rectifier power converter.

25. The method of claim 14 wherein operation of sampling the analog rectifier power stage current input signal comprises sampling the analog rectifier power stage current input signal during an on-time of the switching transistor of the rectifier power converter.

26. The method of claim 25 wherein operation of sampling the analog rectifier power stage current input signal comprises sampling the analog rectifier power stage current input signal at approximately a middle of an on-time of the switching transistor of the rectifier power converter.

* * * * *